US007119879B2

(12) United States Patent
Morisada

(10) Patent No.: US 7,119,879 B2
(45) Date of Patent: *Oct. 10, 2006

(54) STAGE ALIGNMENT APPARATUS AND ITS CONTROL METHOD, EXPOSURE APPARATUS, AND SEMICONDUCTOR DEVICE MANUFACTURING METHOD

(75) Inventor: Masahiro Morisada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/188,620

(22) Filed: Jul. 26, 2005

(65) Prior Publication Data

US 2006/0044537 A1 Mar. 2, 2006

Related U.S. Application Data

(62) Division of application No. 10/368,621, filed on Feb. 20, 2003, now Pat. No. 6,975,383.

(30) Foreign Application Priority Data

Feb. 26, 2002 (JP) ............................ 2002-050289

(51) Int. Cl.

*G03B 27/42* (2006.01)
*G03B 27/58* (2006.01)
*H02K 41/00* (2006.01)
*G05B 11/00* (2006.01)

(52) U.S. Cl. ............................ 355/53; 355/72; 310/12; 318/687

(58) Field of Classification Search .................. 355/53, 355/72, 75, 77; 318/625, 687; 310/12

See application file for complete search history.

(56) References Cited

U.S. PATENT DOCUMENTS 5,523,843 A 6/1996 Yamane et al. ............. 356/636
5,760,564 A 6/1998 Novak ........................ 318/687
5,936,710 A 8/1999 Itoh et al. ..................... 355/53
6,008,882 A 12/1999 Ito et al. ....................... 355/53

(Continued)

FOREIGN PATENT DOCUMENTS

EP 1 107 067 A2 6/2001

(Continued)

OTHER PUBLICATIONS

Chinese Office Action dated Aug. 27, 2004, issued in corresponding Chinese patent application No. 031063934.

(Continued)

*Primary Examiner*—Alan Mathews
(74) *Attorney, Agent, or Firm*—Fitzpatrick, Cella, Harper & Scinto

(57) ABSTRACT

A stage alignment apparatus includes a first moving member which moves in a first direction, a second moving member which moves in a second direction different from the first direction, a stage which is slidably supported by the first moving member and the second moving member and is guided in the first and second directions, a first control section which controls a posture of the first moving member in a third direction, the third direction being a direction rotatable about an axis substantially perpendicular to the first and second directions, and a second control section which controls a posture of the second moving member in the third direction on the basis of a signal which controls the posture of the first moving member in the third direction.

17 Claims, 8 Drawing Sheets

U.S. PATENT DOCUMENTS

| | | | | |
|---|---|---|---|---|
| 6,160,612 | A | 12/2000 | Itoh et al. | 355/53 |
| 6,359,679 | B1 | 3/2002 | Ito et al. | 355/75 |
| 6,449,030 | B1 | 9/2002 | Kwan | 355/72 |
| 6,525,803 | B1 | 2/2003 | Kwan et al. | 355/53 |
| 6,584,367 | B1 | 6/2003 | Makino et al. | 700/60 |
| 6,593,997 | B1 | 7/2003 | Watson et al. | 355/53 |
| 6,603,531 | B1 | 8/2003 | Binnard | 355/53 |
| 6,635,887 | B1 | 10/2003 | Kwan et al. | 250/491.1 |
| 6,671,036 | B1 | 12/2003 | Kwan | 355/72 |
| 6,975,383 | B1 * | 12/2005 | Morisada | 355/53 |
| 2001/0015799 | A1 | 8/2001 | Asano et al. | 355/72 |
| 2002/0140921 | A1 | 10/2002 | Morisada | 355/73 |

FOREIGN PATENT DOCUMENTS

| | | |
|---|---|---|
| EP | 1 111 469 A2 | 6/2001 |
| JP | 6-163359 | 6/1994 |
| JP | 9-34135 | 2/1997 |
| JP | 2001-22448 | 1/2001 |
| JP | 2001-284437 | 10/2001 |
| JP | 2001-351856 | 12/2001 |
| JP | 2002-015985 | 1/2002 |
| JP | 2002-025902 | 1/2002 |

OTHER PUBLICATIONS

European Search Report dated Aug. 6, 2004, Issued in corresponding European patent application No. 03 25 0992, forwarded in a Communication dated Aug. 17, 2004.

Japanese Office Action dated Jun. 18, 2004, issued in corresponding Japanese patent application No. 2002-050289, with English translation.

* cited by examiner 10a, 10b
LASER INTERFEROMETER
TARGET ROTATION ANGLE OF Y MOVING MEMBER
11
PID CONTROLLER
13
AMPLIFIER
6a, 6b
LINEAR MOTOR
4
Y MOVING MEMBER
ROTATION ANGLE OF Y MOVING MEMBER
15
FILTER
TARGET ROTATION ANGLE OF X MOVING MEMBER
12
PID CONTROLLER
14
AMPLIFIER
5a, 5b
LINEAR MOTOR
3
X MOVING MEMBER
ROTATION ANGLE OF X MOVING MEMBER
9a, 9b
LASER INTERFEROMETER
–
–

10a, 10b
LASER INTERFEROMETER
TARGET ROTATION ANGLE OF Y MOVING MEMBER
-
11
PID CONTROLLER
13
AMPLIFIER
6a, 6b
LINEAR MOTOR
4
Y MOVING MEMBER
ROTATION ANGLE OF Y MOVING MEMBER
16
FILTER
15
FILTER
12
PID CONTROLLER
14
AMPLIFIER
5a, 5b
LINEAR MOTOR
3
X MOVING MEMBER
ROTATION ANGLE OF X MOVING MEMBER
TARGET ROTATION ANGLE OF X MOVING MEMBER
-
9a, 9b
LASER INTERFEROMETER

WAFER PROCESS

STAGE ALIGNMENT APPARATUS AND ITS CONTROL METHOD, EXPOSURE APPARATUS, AND SEMICONDUCTOR DEVICE MANUFACTURING METHOD

This application is a divisional application of U.S. patent application Ser. No. 10/368,621, filed Feb. 20, 2003 now U.S. Pat. No. 6,975,383.

FIELD OF THE INVENTION

The present invention relates to a stage alignment apparatus for driving a stage and its control method, an exposure apparatus, and a semiconductor device manufacturing method.

BACKGROUND OF THE INVENTION

Many apparatuses are used as an apparatus arranged to align an object on a stage in which the stage moves on a surface plate. Among such apparatuses, there exists an apparatus which has two beam-like moving members that can move in two directions perpendicular to each other and a stage that moves in accordance with the moving members, and in which these moving members are guided in the respective directions by guides to drive the stage. This type of apparatus has motors which drive a moving member at the two ends thereof, and the motors with an excellent driving capability can be arranged. Hence, a stage can be moved at high speed. Since the stage and the motors are separated from each other, the motors can efficiently be cooled. In this type of apparatus, however, the two moving members may thermally expand, each moving member and its motor may be different in parallelism, or the moving member may rotate in the horizontal direction. For this reason, the moving members and stage, which can inherently move relative to each other, are likely to excessively constrain each other. When the moving members and stage fall into this excessive constraint stage, they may come in contact with each other to restrict mutual movement, or the alignment precision of the stage may degrade due to vibrations caused by interference between the two moving members.

In a method disclosed in Japanese Patent Laid-Open No. 9-34135, a mechanical means is provided, and the fit tolerance of the first moving member and stage is improved to tightly fit them with no play while the second moving member and stage are loosely fitted, thereby attempting to solve the above-mentioned problem.

In a conventional method, however, new vibrations may occur by providing a mechanism such as a spring or the like. Additionally, control of one of two moving members in a tight constraint state makes it difficult to align a stage at high precision. Moreover, the mechanism such as a spring or the like between the second moving member and a bearing increases the complexity of the apparatus.

SUMMARY OF THE INVENTION

The present invention has been made in consideration of the above-mentioned problems, and has as its object to provide a stage alignment apparatus and its control method, an exposure apparatus, and a semiconductor device manufacturing method by, e.g., controlling the posture of the second moving member on the basis of a signal which controls the posture of the first moving member.

According to the first aspect of the present invention, there is provided a stage alignment apparatus characterized by comprising a first moving member which can move in a first direction, a second moving member which can move in a second direction different from the first direction, a stage which is slidably supported by the first moving member and second moving member and is guided in the first and second directions, a first control section which controls a posture, in a third direction different from the first and second directions, of the first moving member, and a second control section which controls a posture, in the third direction, of the second moving member on the basis of a signal which controls the posture of the first moving member.

According to a preferred embodiment of the present invention, each of the first control section and second control section has a measurement section which measures the posture of the moving member, and an actuator which drives the moving member on the basis of a measurement result obtained by the measurement section.

According to a preferred embodiment of the present invention, the actuator comprises a linear motor.

According to a preferred embodiment of the present invention, the second control section controls the posture of the second moving member on the basis of a signal which controls the posture of the first moving member filtered by a predetermined filter.

According to a preferred embodiment of the present invention, the first and second directions are perpendicular to each other, and the third direction is a rotational angle about an axis perpendicular to the first and second directions.

According to a preferred embodiment of the present invention, the first moving member and second moving member are supported by guides arranged such that their ends are parallel to the first and second directions, respectively, and a bearing which slides with a predetermined gap that allows rotational displacement in the third direction with respect to the guides and are guided in the first and second directions through the guides and bearing.

According to a preferred embodiment of the present invention, the first control section performs calculations of a proportional term, an integral term, and a derivative term to obtain a signal which controls the posture of the first moving member, and the second control section performs calculations of a proportional term and a derivative term to obtain the posture of the second moving member.

According to a preferred embodiment of the present invention, the first control section controls the posture of the first moving member on the basis of a signal which controls the posture of the second moving member.

According to the second aspect of the present invention, there is provided a method of controlling a stage alignment apparatus for guiding a stage in a first direction and a second direction different from the first direction by a first moving member which can move in the first direction and a second moving member which can move in the second direction, characterized by comprising the first control step of controlling a posture, in a third direction different from the first and second directions, of the first moving member, and the second control step of controlling the posture in the third direction of the second moving member on the basis of a signal which controls a posture of the first moving member.

According to a preferred embodiment of the present invention, in the first control step, the posture of the first moving member is controlled on the basis of a signal which controls a posture of the second moving member.

According to the third aspect of the present invention, there is provided an exposure apparatus characterized in that the exposure apparatus uses a stage alignment apparatus controlled by a control method according to the present invention to transfer a pattern.

According to the fourth aspect of the present invention, there is provided a semiconductor device manufacturing method characterized by comprising the coating step of coating a substrate with a photosensitive member, the exposure step of transferring a pattern onto the substrate coated with the photosensitive member in the coating step using an exposure apparatus according to the present invention, and the development step of developing the photosensitive member of the substrate on which the pattern is transferred in the exposure step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

[First Embodiment]

Figure 1A:
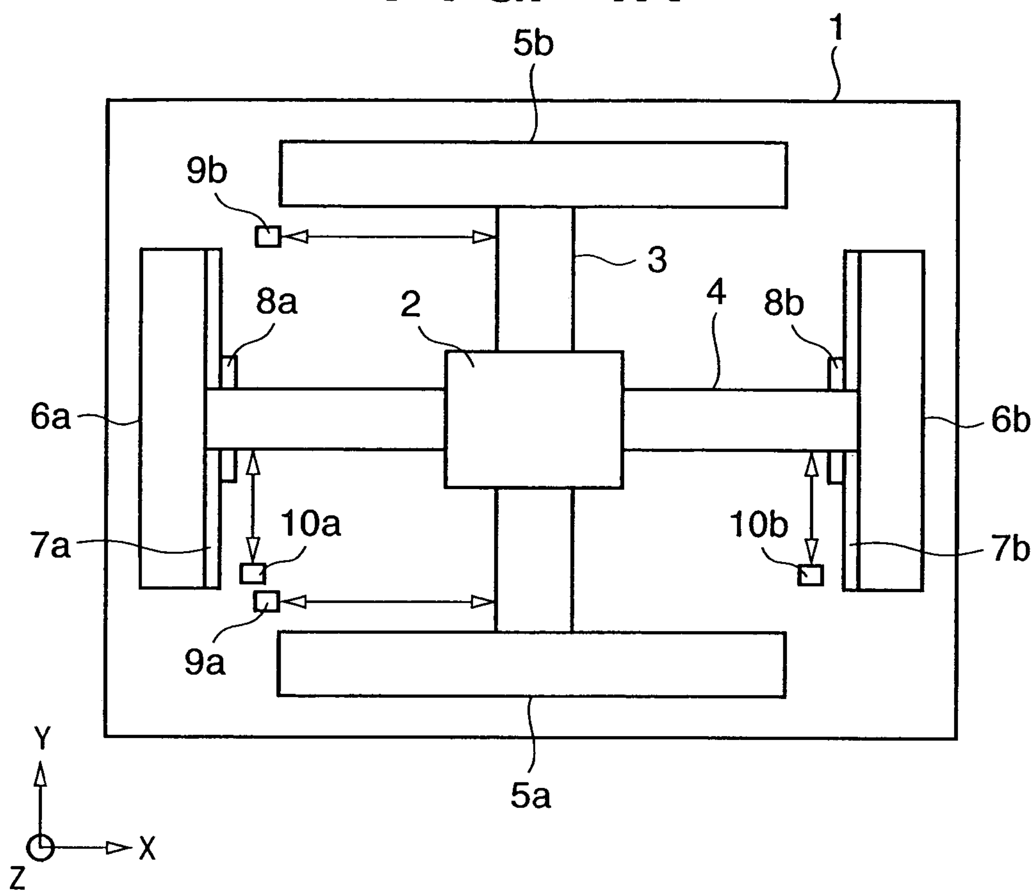
FIG. 1A is a block diagram showing the arrangement of a stage alignment apparatus according to a preferred embodiment of the present invention.
Figure 1B:
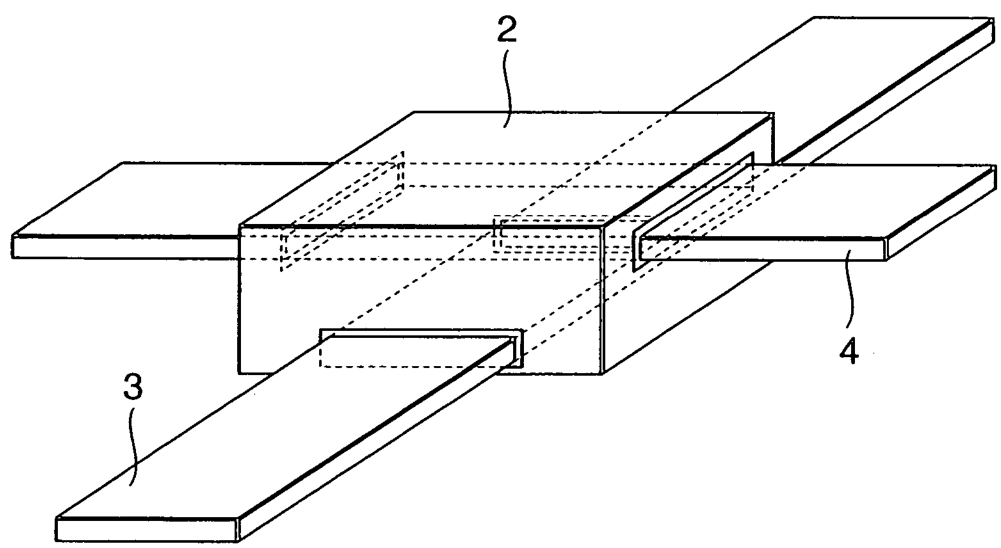
FIG. 1B is a block diagram showing the arrangement of the stage alignment apparatus according to the preferred embodiment of the present invention.

FIGS. 1A and 1B are views showing the schematic arrangement of a stage alignment apparatus according to a preferred embodiment of the present invention. FIG. 1A is a plan view of the stage alignment apparatus, and FIG. 1B, a perspective view of the stage alignment apparatus.

In FIG. 1A, the stage alignment apparatus has a surface plate 1, a stage 2 which moves on the surface plate 1 through the surface plate 1 and a bearing (not shown) (e.g., a hydrostatic bearing), a beam-like X moving member 3 which guides the stage 2 in the Y direction, a beam-like Y moving member 4 which guides the stage 2 in the X direction and is substantially perpendicular to the X moving member 3, and a control section which controls the postures (e.g., the rotational displacements, translational displacements, and the like) of the X moving member 3 and Y moving member 4. The control section includes linear motors 5*a* and 5*b* which are arranged at the two ends of the X moving member 3 to drive the X moving member 3 in the X direction, linear motors 6*a* and 6*b* which are arranged at the two ends of the Y moving member 4 to drive the Y moving member 4 in the Y direction, Y guides 7*a* and 7*b* which guide the Y moving member 4 in the Y direction through hydrostatic pads 8*a* and 8*b*, respectively, laser interferometers 9*a* and 9*b* which measure the posture (e.g., the displacement in the X direction, the rotational displacement in the θ z direction, and the like) of the X moving member 3, and laser interferometers 10*a* and 10*b* which measure the posture (e.g., the displacement in the Y direction, the rotational displacement in the θ z direction, and the like) of the Y moving member 4.

The stage 2 includes, e.g., the arrangement shown in FIG. 1B. The stage 2 is slidably supported by the X moving member 3 and guided along the X moving member 3 to move in the Y direction. The stage 2 is also slidably supported by the Y moving member 4 and moves in the X direction along the Y moving member 4. The Y moving member 4 with the hydrostatic pads 8*a* and 8*b* mounted thereon moves in the Y direction along the Y guides 7*a* and 7*b*. The Y guides 7*a* and 7*b* are fixed on the surface plate 1. Permanent magnets are fixed at the two ends of the X moving member 3, and the X moving member 3 can be driven in the X direction by supplying an electric current to the coils of the linear motors 5*a* and 5*b*. Since there are gaps between the hydrostatic pads 8*a* and 8*b* and the Y guides 7*a* and 7*b*, the Y moving member 4 can rotate in the θ z direction by the gap. In addition, the X moving member 3 can rotate in the θ z direction by a gap between the stage 2 and the bearing.

Figure 2:
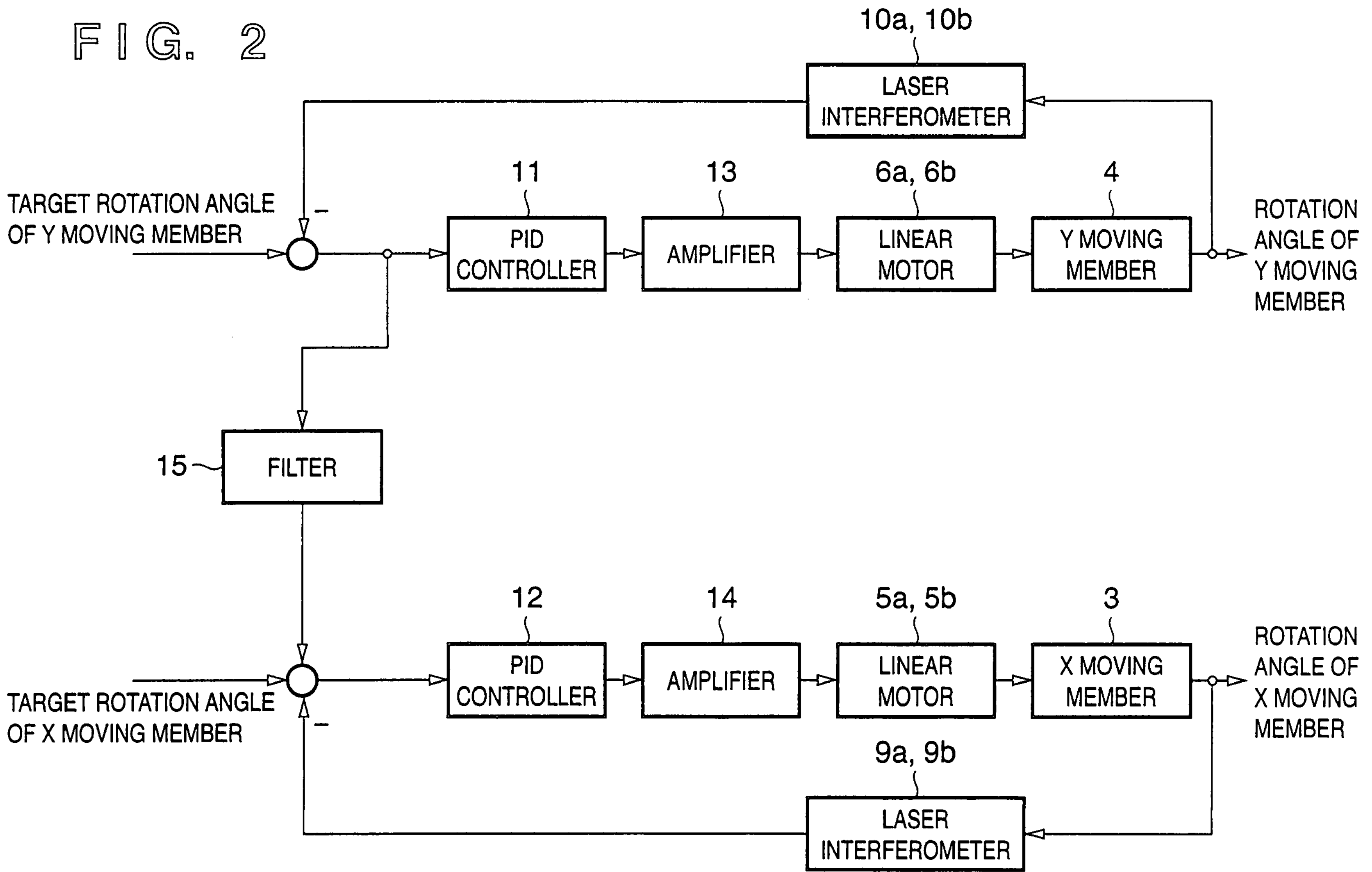
FIG. 2 is a block diagram showing the arrangement of a control section which controls the Z-axis rotational displacements of an X moving member and a Y moving member.

FIG. 2 is a block diagram illustrating the arrangement of a control section which controls the Z-axis rotational displacements of the X moving member 3 and Y moving member 4 in the stage alignment apparatus according to the preferred embodiment of the present invention.

In FIG. 2, this control section includes, e.g., a PID controller 11 which performs a control calculation such that the Y moving member 4 forms a predetermined target rotation angle θz0, a PID controller 12 which performs a control calculation such that the X moving member 3 forms a predetermined target rotation angle θz0', amplifiers 13 and 14 which amplify electrical currents, and a filter 15 which has a predetermined frequency characteristic.

First, a rotation angle θz of the Y moving member 4 is measured by the laser interferometers 10*a* and 10*b*. The difference between the measured rotation angle θz and the target rotation angle θz0 is input to the PID controller 11. The PID controller 11 performs a control signal calculation (PID calculation) for this input using a proportional term, an integral term, and a derivative term. The amplifier 13 amplifies the output from the PID controller 11. The linear motors 6*a* and 6*b* drive the Y moving member 4 on the basis of the output from the amplifier 13. The rotation angle θz when the Y moving member 4 is driven is measured by the laser interferometers 10*a* and 10*b*, and the measurement result is fed back to the PID controller 11. The difference between the rotation angle θz, which has been measured by the laser interferometers 10_a_ and 10_b_, and the target rotation angle θz0 is also input to the filter 15. The input is subjected to predetermined filtering and calculation (to be described later) and then added to an input to the PID controller 12.

On the other hand, the rotation angle θ z' of the X moving member 3 is measured by the laser interferometers 9_a_ and 9_b_. The difference between the measured rotation angle θ z' of the X moving member 3 and the target rotation angle θ z0', and that between the rotation angle θ z of the Y moving member 4 after the predetermined filtering and calculation (to be described later) and the target rotation angle θ z0 are input to the PID controller 12. The PID controller 12 performs PID calculation for this input. The amplifier 14 amplifies the output from the PID controller 12. The linear motors 5_a_ and 5_b_ drive the X moving member 3 on, the basis of the output from the amplifier 14. The rotation angle θ z' when the X moving member 3 is driven is measured by the laser interferometers 9_a_ and 9_b_, and the measurement result is fed back to the PID controller 12. In this manner, since the difference between the rotation angle θ z of the Y moving member 4 and the target rotation angle θ z0 is input to the PID controller 12, the X moving member 3 can move in accordance with the control result for the Y moving member 4.

In this embodiment, though calculation of the differences between the rotation angles of the X moving member 3 and Y moving member 4 and the target rotation angle, calculation by the PID controllers 11 and 12, and calculation by the filter 15 are implemented as software on a computer, the present invention is not limited to this. Part or all of these calculations may be implemented by hardware including at least one of an analog arithmetic element and a digital arithmetic element.

Figure 3:
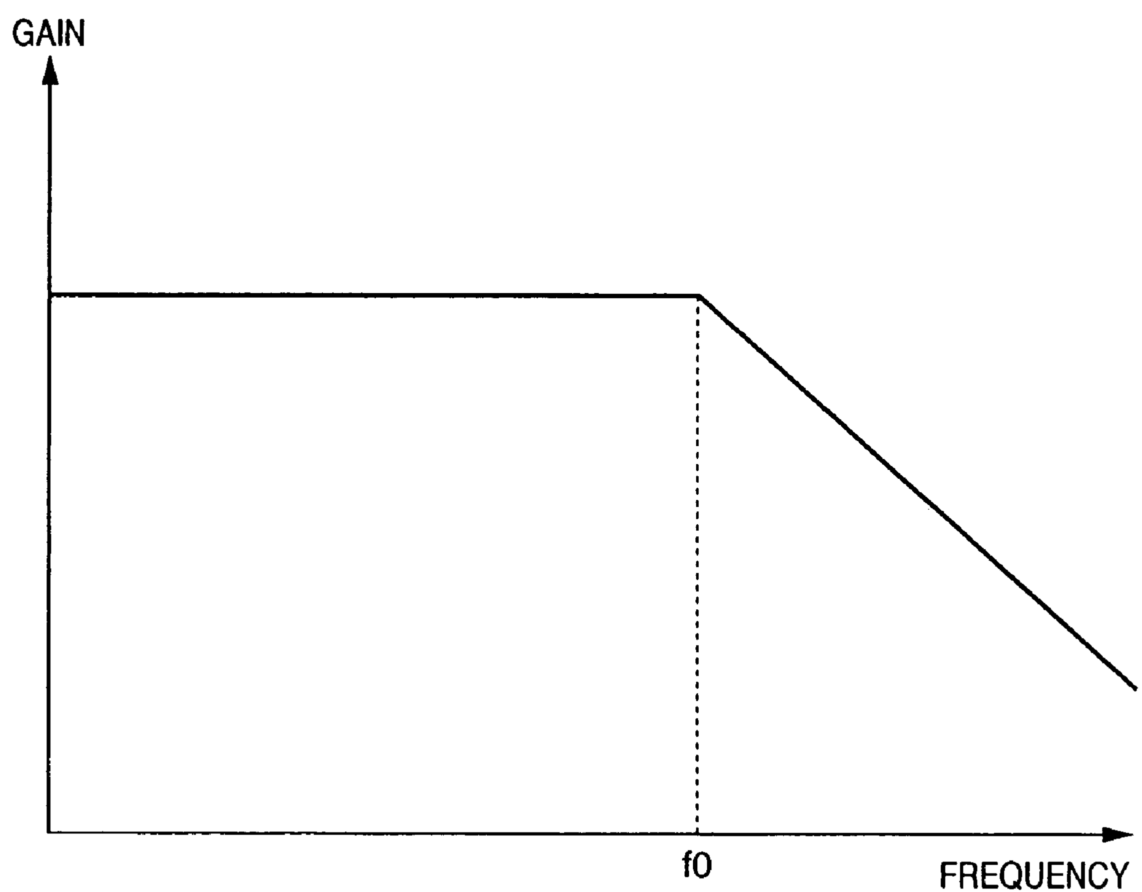
FIG. 3 is a graph showing a frequency characteristic of a filter in FIG. 2.

FIG. 3 is a graph showing a frequency characteristic of the filter 15 shown in FIG. 2. The filter 15 is designed to suppress, e.g., frequency components higher than a predetermined frequency f0 of a signal indicating the rotational displacement of the Y moving member 4. This can eliminate extra high-frequency components generated in a signal indicating the rotational displacement of the Y moving member 4 to control the X moving member 3 more precisely.

Figure 4:
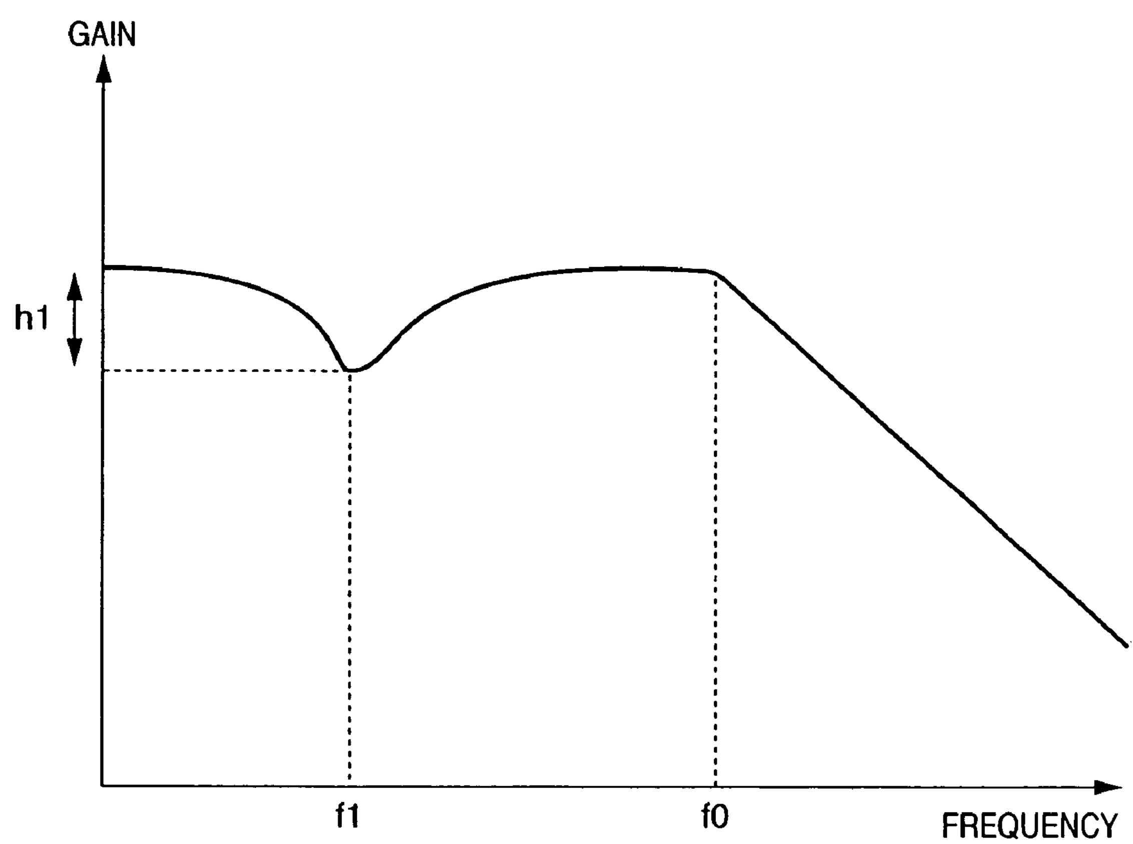
FIG. 4 is a graph showing another frequency characteristic of the filter in FIG. 2.

FIG. 4 is a graph showing a frequency characteristic of the filter 15, which is different from that shown in FIG. 3. The filter 15 can cause the X moving member 3 to track the Y moving member 4 at further higher precision by setting a peak value h1 and a frequency f1 of a frequency response in accordance with the values h1 and f1 of the frequency response of a signal indicating the target rotation angle of the X moving member 3.

Additionally, a situation wherein the X moving member 3 is pressed against the bearing with excessive force can be avoided by setting the coefficient of the integral term of the PID controller 12 to zero to obviate the need to perform integral calculation.

As described above, according to the preferred embodiment of the present invention, by improving a controller without an increase in complexity of the apparatus by addition of a mechanical element to a moving member, any excessive constraint which may occur between the moving member and a stage and any vibrations caused by this constraint can be avoided. A controller according to the preferred embodiment of the present invention can be implemented at a low cost by software.

A signal for controlling the posture (e.g., the rotational displacement, translational displacement, and the like) of the first moving member is input to a control system which controls the posture (e.g., the rotational displacement, translational displacement, and the like) of the second moving member to allow a change in tracking performance of the second moving member. For example, the frequency response of a filter is set in accordance with the peak value and the frequency of the frequency response in an output signal from the control system which controls the second moving member, so that the second moving member can follow the first moving member further precisely.

[Second Embodiment]

Figure 5:
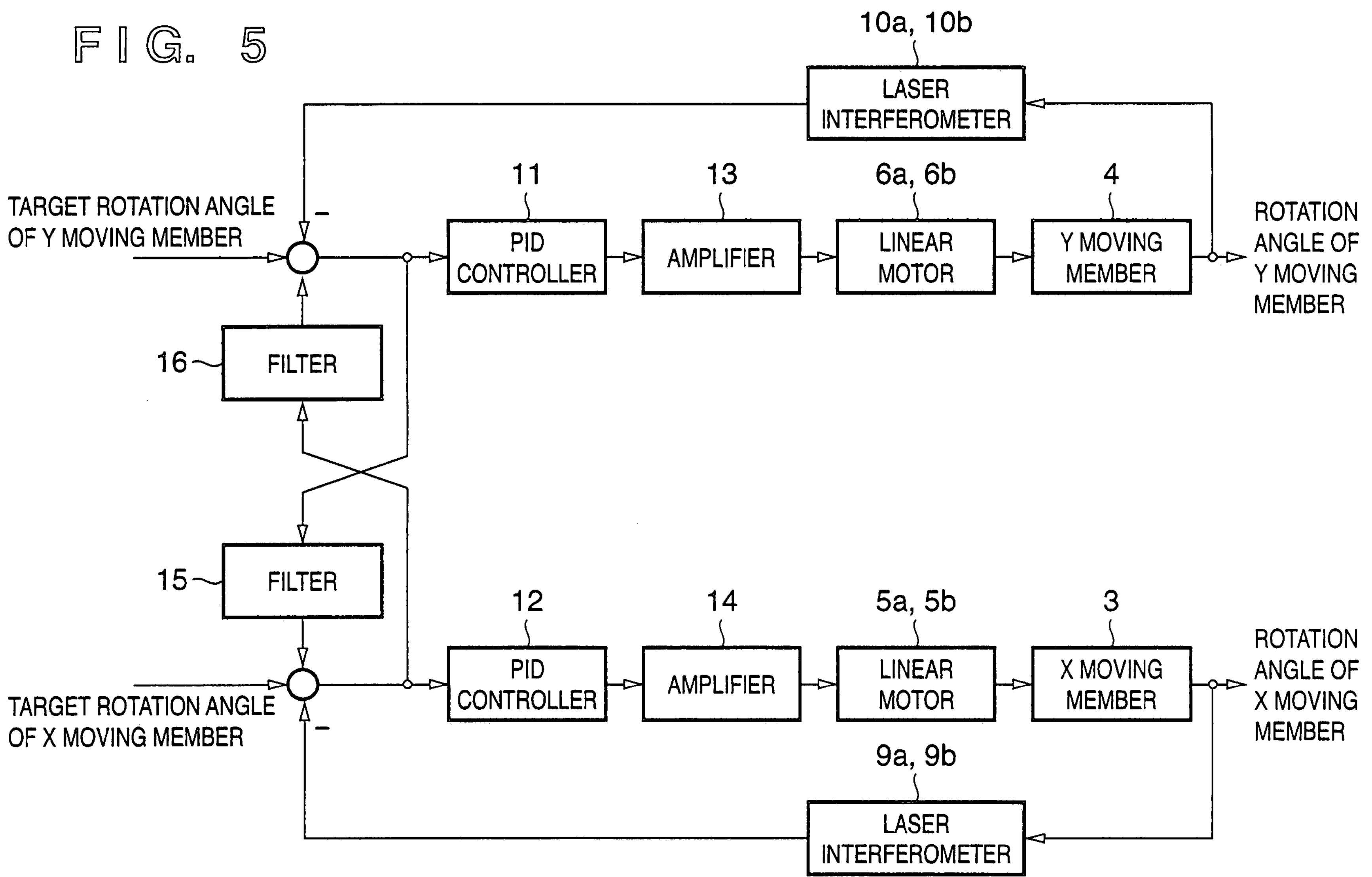
FIG. 5 is a block diagram showing the arrangement of a control section which controls the Z-axis rotational displacements of an X moving member and a Y moving member in the controller of a stage alignment apparatus according to the second preferred embodiment of the present invention.

FIG. 5 is a block diagram showing the arrangement of a control section which controls the Z-axis rotational displacements of an X moving member 3 and a Y moving member 4 in a stage alignment apparatus according to the second preferred embodiment of the present invention. The same reference numerals denote the parts similar to those in the first embodiment. The difference from the first embodiment lies in that a filter 16 with a predetermined frequency characteristic is provided. The filter 16 performs predetermined calculation for a signal indicating the difference between a rotation angle θ z' of the X moving member 3 and a target rotation angle θ z0', and the calculation result is added to an input to a PID controller 11. This can cause the Y moving member 4 to track the X moving member 3 when a rotational displacement occurs in the X moving member 3, as in a case wherein the X moving member 3 is made to track the Y moving member 4 when a rotational displacement occurs in the Y moving member 4 in FIG. 2.

[Other Embodiment]

An embodiment in which a stage alignment apparatus according to the present invention is applied to an exposure apparatus used in the manufacturing process of a semiconductor device will be described next.

Figure 6:
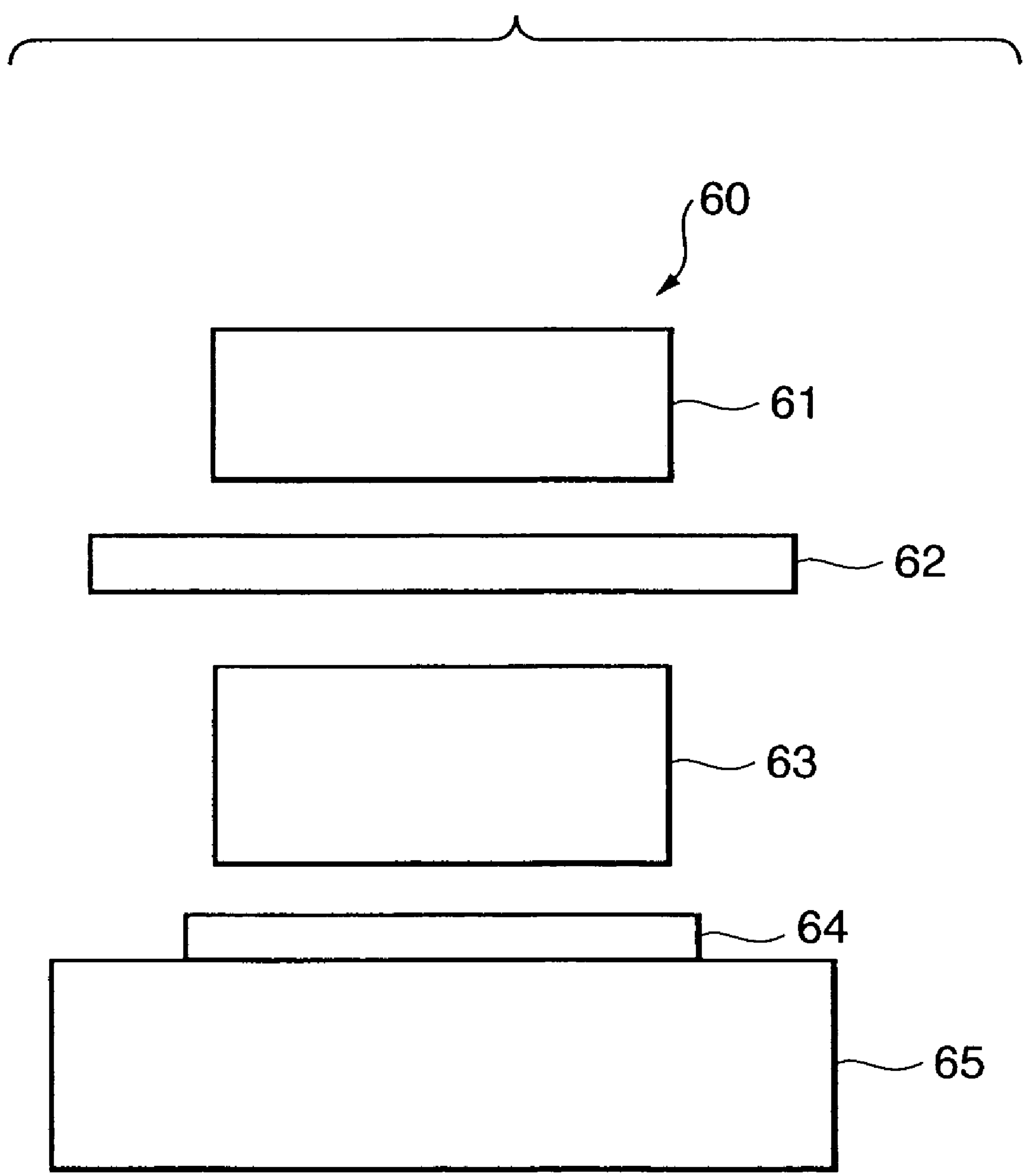
FIG. 6 is a view showing the concept of an exposure apparatus used when a stage alignment apparatus of the present invention is applied to the manufacturing process of a semiconductor device.

FIG. 6 shows the concept of an exposure apparatus used when a stage alignment apparatus according to the present invention is applied to the manufacturing process of a semiconductor device.

An exposure apparatus 60 according to a preferred embodiment of the present invention is comprised of an illumination optical system 61, a reticle 62, a projection optical system 63, a substrate 64, and a stage 65. The illumination optical system 61 can employ, as exposure light, e.g., ultraviolet rays which use an excimer laser, a fluorine excimer laser, or the like, as a light source. Light emitted from the illumination optical system 61 illuminates the reticle 62. The light having passed through the reticle 62 is focused on the substrate 64 through the projection optical system 63 to expose a photosensitive member applied on the substrate 64. The substrate 64 is moved to a predetermined position by the stage 65 using the stage alignment apparatus according to the preferred embodiment of the present invention.

Figure 7:
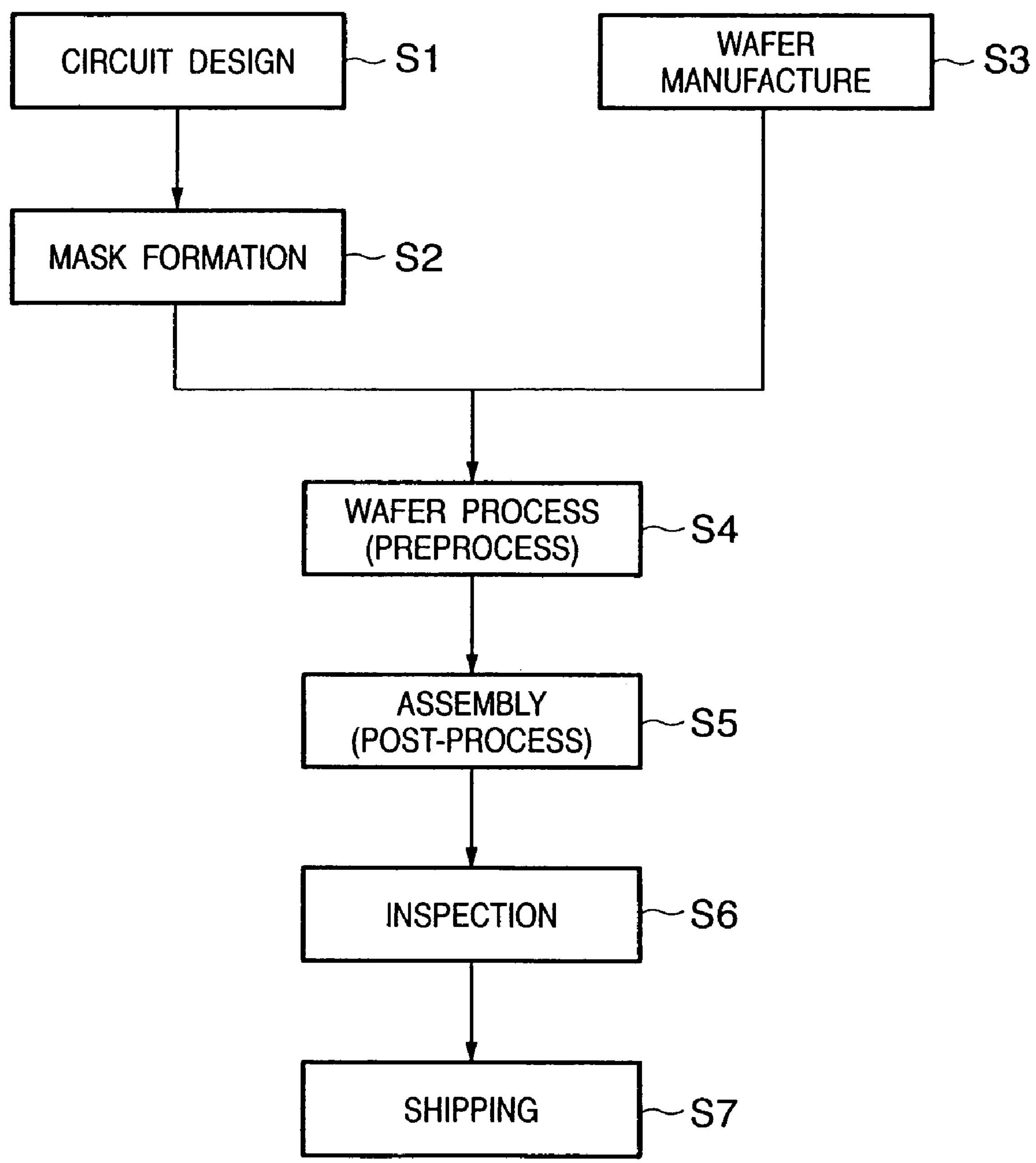
FIG. 7 is a flow chart showing the flow of the whole manufacturing process of a semiconductor device.

FIG. 7 shows the flow of the whole manufacturing process of the semiconductor device using the above-mentioned exposure apparatus. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a preprocess, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 8:
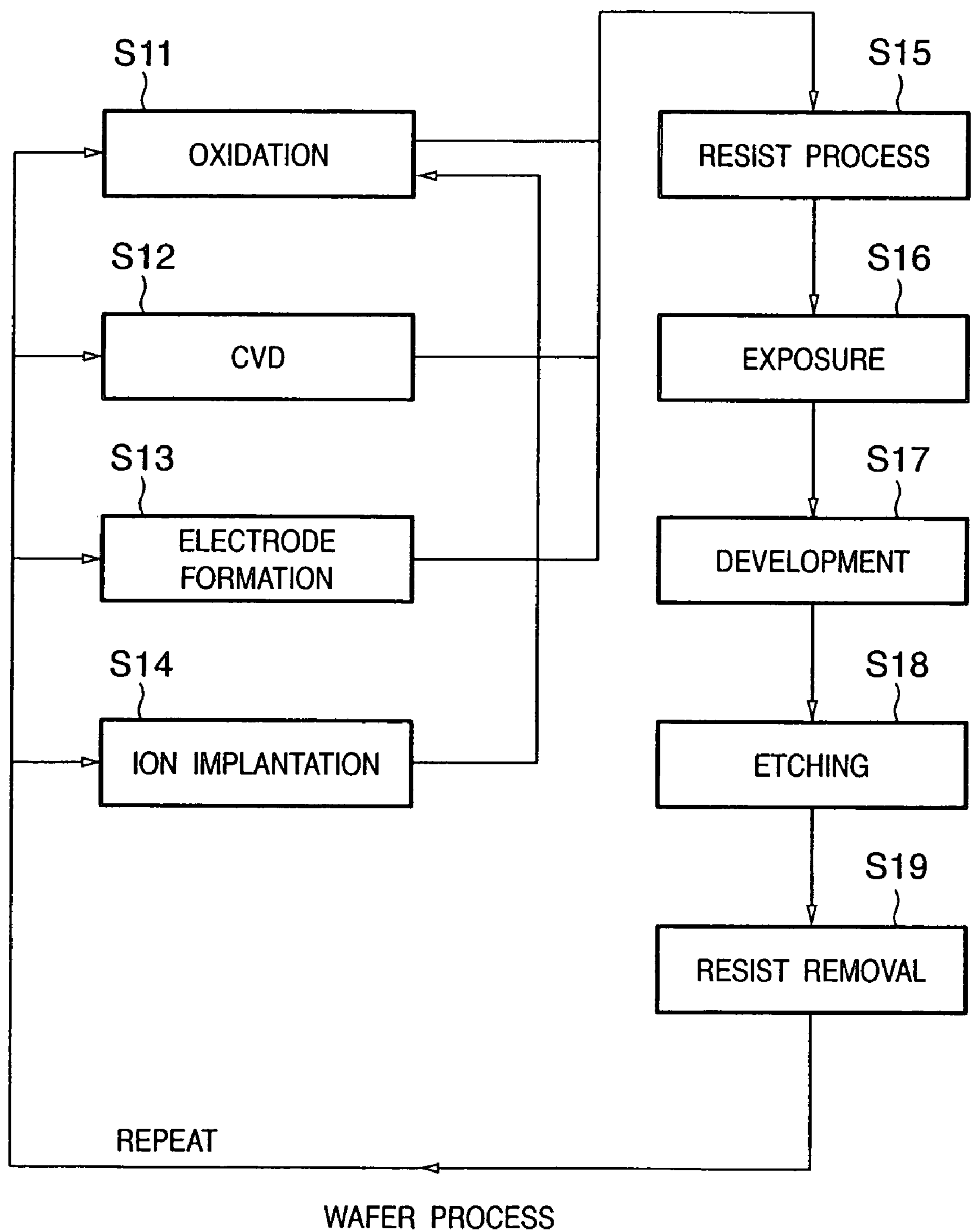
FIG. 8 is a flow chart showing the detailed flow of the wafer process.

FIG. 8 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the wafer is moved at high precision using the above-mentioned exposure apparatus, and the circuit pattern is transferred onto the wafer. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

With the above-mentioned process, any vibrations which may occur upon stage movement in the exposure step are suppressed, and thus a circuit pattern can be transferred onto a wafer at higher precision.

According to the present invention, by, e.g., controlling the posture of the second moving member on the basis of a signal for controlling the posture of the first moving member, a stage alignment apparatus, which precisely moves a stage and its control method, an exposure apparatus and a semiconductor device manufacturing method, can be provided.

As many apparently widely different embodiments of the present invention can be made without departing from the spirit and scope thereof, it is to be understood that the invention is not limited to the specific embodiments thereof except as defined in the claims.

What is claimed is:

1. A stage alignment apparatus comprising:

a first moving member which moves in a first direction;

a second moving member which moves in a second direction different from the first direction;

a stage which is slidably supported by said first moving member and said second moving member and is guided in the first and second directions;

a first control section which controls a posture of said first moving member in a third direction, the third direction being a direction rotatable about an axis substantially perpendicular to the first and second directions; and a second control section which controls a posture of said second moving member in the third direction on the basis of a signal which controls the posture of said first moving member in the third direction.

2. The apparatus according to claim 1, wherein each of said first control section and said second control section has:

a measurement section which measures the posture of a respective moving member; and an actuator which drives a respective moving member on the basis of a measurement result obtained by said measurement section.

3. The apparatus according to claim 2, wherein the actuator comprises a linear motor.

4. The apparatus according to claim 1, wherein said second control section controls the posture of said second moving member on the basis of a signal which controls the posture of the first moving member filtered by a predetermined filter.

5. The apparatus according to claim 1, wherein said first moving member and said second moving member are supported by guides arranged such that their ends are parallel to the first and second directions, respectively, and a bearing which slides with a predetermined gap that allows rotational displacement in the third direction with respect to the guides and are guided in the first and second directions through the guides and bearing.

6. The apparatus according to claim 1, wherein said first control section performs calculations of a proportional term, an integral term, and a derivative term to obtain a signal which controls the posture of said first moving member, and said second control section performs calculations of a proportional term and derivative term to obtain the posture of said second moving member.

7. The apparatus according to claim 1, wherein said first control section controls the posture of said first moving member on the basis of a signal which controls the posture of said second moving member.

8. A method of controlling a stage alignment apparatus for guiding a stage in a first direction and a second direction different from the first direction by a first moving member which can move in the first direction and a second moving member which can move in the second direction, said method comprising:

a step of moving the first moving member in a third direction, the third direction being a direction rotatable about an axis substantially perpendicular to the first and second directions; and a step of controlling a posture of the second moving member in the third direction on the basis of a signal which controls the posture of the first moving member in the third direction.

9. The method according to claim 8, wherein in the first control step, the posture of the first moving member is controlled on the basis of a signal which controls a posture of the second moving member.

10. A semiconductor device manufacturing method comprising:

a coating step of coating a substrate with a photosensitive member;

an exposure step of transferring a pattern onto the substrate coated with the photosensitive member;

an exposure step of transferring a pattern onto the substrate coated with the photosensitive member in the coating step using a method of controlling a stage alignment apparatus according to claim 8; and a development step of developing the photosensitive member of the substrate on which the pattern is transferred in said exposure step.

11. A stage alignment apparatus comprising:

a stage;

a first guiding member which guides said stage in a first direction;

a second guiding member which guides said stage in a second direction perpendicular to the first direction;

a first driving member which drives said first guiding member in a direction rotatable about an axis substantially perpendicular to the first and second directions and in the second direction;

a second driving member which drives said second guiding member in the rotatable direction and in the first direction; and a control member which controls said first driving member and said second driving member, wherein said control member controls a rotation of said second guiding member on the basis of a signal which controls the rotation of said first guiding member.

12. The apparatus according to claim 11, further comprising:

a first measurement member which measures a position of said first guiding member in the rotatable direction; and a second measurement member which measures a position of said second guiding member in the rotatable direction.

13. The apparatus according to claim 11, further comprising:

a first linear motor arranged at both ends of said first guiding member; and a second linear motor arranged at both ends of said second guiding member.

14. The apparatus according to claim 11, wherein the signal is filtered.

15. The apparatus according to claim 11, further comprising:

a base which supports said stage; and a guide which is fixed on said base, wherein at least one of said first guiding member and said second guiding member is guided by said guide through bearings.

16. An exposure apparatus comprising:

an exposure member for transferring a pattern onto a substrate; and a stage for moving said substrate, wherein said stage is aligned by said apparatus according to claim 11.

17. A device manufacturing method comprising:

a step of transferring a pattern onto the substrate by using the exposure apparatus according to claim 16; and a step of developing the transferred pattern.

* * * * *

UNITED STATES PATENT AND TRADEMARK OFFICE

CERTIFICATE OF CORRECTION

PATENT NO. : 7,119,879 B2
APPLICATION NO. : 11/188620
DATED : October 10, 2006
INVENTOR(S) : Masahiro Morisada It is certified that error appears in the above-identified patent and that said Letters Patent is hereby corrected as shown below:

ON THE TITLE PAGE:

In item "(56) References Cited," on "Page 2," under "OTHER PUBLICATIONS," in the first line of the first-listed document, "Issued" should read -- issued --.

COLUMN 5:

Line 15, "on," should read -- on --.

Signed and Sealed this

Fourth Day of September, 2007

JON W. DUDAS

*Director of the United States Patent and Trademark Office*